United States Patent
Shah et al.

(10) Patent No.: US 8,831,785 B2
(45) Date of Patent: Sep. 9, 2014

(54) MULTI-STAGE HUMIDITY CONTROL SYSTEM AND METHOD

(75) Inventors: Amip Shah, Santa Clara, CA (US); Cullen Bash, Los Gatos, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 498 days.

(21) Appl. No.: 13/127,233

(22) PCT Filed: Oct. 30, 2008

(86) PCT No.: PCT/US2008/081773
§ 371 (c)(1),
(2), (4) Date: May 2, 2011

(87) PCT Pub. No.: WO2010/050953
PCT Pub. Date: May 6, 2010

(65) Prior Publication Data
US 2011/0264277 A1    Oct. 27, 2011

(51) Int. Cl.
*F24F 6/00* (2006.01)
*G05D 23/19* (2006.01)
*H05K 7/20* (2006.01)
*F24F 11/00* (2006.01)

(52) U.S. Cl.
CPC ........ H05K 7/20745 (2013.01); *F24F 11/0015* (2013.01)
USPC ................ 700/276; 165/229; 165/230; 95/10

(58) Field of Classification Search
CPC ..... F24F 11/0015; F24F 1/00; H05K 7/20745
USPC ........................ 700/276; 165/229–230; 95/10
See application file for complete search history.

(56) References Cited

U.S. PATENT DOCUMENTS

| | | | | |
|---|---|---|---|---|
| 4,350,286 A | * | 9/1982 | Sutoh et al. | 236/44 A |
| 6,027,030 A | * | 2/2000 | Buijsse | 236/44 C |
| 6,079,483 A | * | 6/2000 | Morooka et al. | 165/11.1 |
| 6,267,274 B1 | * | 7/2001 | Smrt | 222/646 |
| 6,694,759 B1 | * | 2/2004 | Bash et al. | 62/180 |

(Continued)

FOREIGN PATENT DOCUMENTS

JP          2005-61687     *    3/2005    ...........  F24F 11/02

OTHER PUBLICATIONS

ASHRAE, "ASHRAE Environmental Guidelines for Datacom Equipment", Aug. 1, 2008, pp. 11.*

(Continued)

*Primary Examiner* — Ryan Jarrett
*Assistant Examiner* — Olvin Lopez Alvarez

(57) ABSTRACT

A system for multi-stage control of humidity in fluid flow supplied to at least one information technology apparatus includes a sensor, a first stage apparatus configured to vary humidity levels in the fluid flow, and a second stage apparatus positioned downstream of the first stage apparatus along the fluid flow to further vary humidity levels in the fluid flow. The system also includes a controller configured to receive environmental condition information from the sensor, to determine whether the information indicates that the humidity level is outside of a predetermined range, and to manipulate an operation of at least one of the first stage apparatus and the second stage apparatus to vary the humidity level in the fluid flow in response to the information indicating that the humidity level is outside of the predetermined range.

13 Claims, 5 Drawing Sheets

(56) References Cited

U.S. PATENT DOCUMENTS

| | | | |
|---|---|---|---|
| 6,843,835 B2 * | 1/2005 | Fornai et al. | 96/53 |
| 6,977,587 B2 * | 12/2005 | Pradhan et al. | 340/539.26 |
| 7,218,996 B1 * | 5/2007 | Beitelmal et al. | 700/276 |
| 7,272,945 B2 * | 9/2007 | Bash et al. | 62/180 |
| 7,315,448 B1 * | 1/2008 | Bash et al. | 361/701 |
| 7,640,760 B2 * | 1/2010 | Bash et al. | 62/178 |
| 7,854,389 B2 * | 12/2010 | Ahmed | 236/44 C |
| 7,918,091 B1 * | 4/2011 | Perkins et al. | 60/646 |
| 7,957,842 B2 * | 6/2011 | Boder et al. | 700/283 |
| 8,256,689 B2 * | 9/2012 | Matsubara | 236/44 C |
| 8,292,192 B1 * | 10/2012 | Purswell et al. | 236/44 C |
| 8,491,702 B2 * | 7/2013 | Bash et al. | 95/10 |
| 2006/0100744 A1 * | 5/2006 | Sharma et al. | 700/276 |
| 2007/0062685 A1 * | 3/2007 | Patel et al. | 165/247 |
| 2010/0192605 A1 * | 8/2010 | Fang et al. | 62/235.1 |
| 2010/0300284 A1 * | 12/2010 | Bash et al. | 95/10 |
| 2011/0029152 A1 * | 2/2011 | Patel et al. | 700/300 |

OTHER PUBLICATIONS

Hewlett Packard, "Deploying the console management controller", Apr. 2003, pp. 12.*

* cited by examiner

MULTI-STAGE HUMIDITY CONTROL SYSTEM AND METHOD

BACKGROUND

A data center may be defined as a location, for instance, a room, that houses computer systems arranged in a number of racks. These racks are configured to house a number of computer systems, which typically include a number of printed circuit boards (PCBs), mass storage devices, power supplies, processors, micro-controllers, and semi-conductor devices that dissipate relatively significant amounts of heat during their operation.

One or more air conditioning (AC) units are typically employed to supply cooling airflow to dissipate the heat generated by the computer systems. It is beneficial to control the moisture content in the airflow supplied by the AC units because too much moisture increases the risk of condensation forming on the computer systems and too little moisture increases the risk of electrostatic discharge issues. In order to substantially maintain the moisture content within a desired range, the AC units are often equipped with a humidifier/dehumidifier configured to add or remove moisture content in the cooling airflow. AC units equipped with these devices are also typically equipped with humidity sensors positioned at the returns to detect the relative humidity of the airflow returning into the AC units through returns. In addition, the AC units control the moisture content of the cooling airflow to meet a predetermined relative humidity set point at the returns.

If designed and arranged appropriately, and if the desired relative humidity range is broad, such as, between 20%-80%, the AC units are typically capable of maintaining the relative humidity levels within the desired range. However, because the humidity control is based only on the relative humidity detected at the returns of the AC units and because relative humidity is a function of temperature, when there is a problem, such as, if one of the AC units supplies overly cool airflow, certain areas of the data center may receive the cooler air, which may lead to the formation of condensation in those areas. In addition, the AC units may operate in relatively energy inefficient manners because one AC unit may be humidifying while another AC unit is dehumidifying in supplying cool airflow to the same areas in the data center.

It would thus be desirable to have humidity control in a structure, such as, a data center or a smaller structure with in the data center, such as, a rack or a server, without suffering from the drawbacks and disadvantages associated with conventional humidity control arrangements.

BRIEF DESCRIPTION OF THE DRAWINGS

Features of the present invention will become apparent to those skilled in the art from the following description with reference to the figures, in which.

DETAILED DESCRIPTION

Figure 1A:
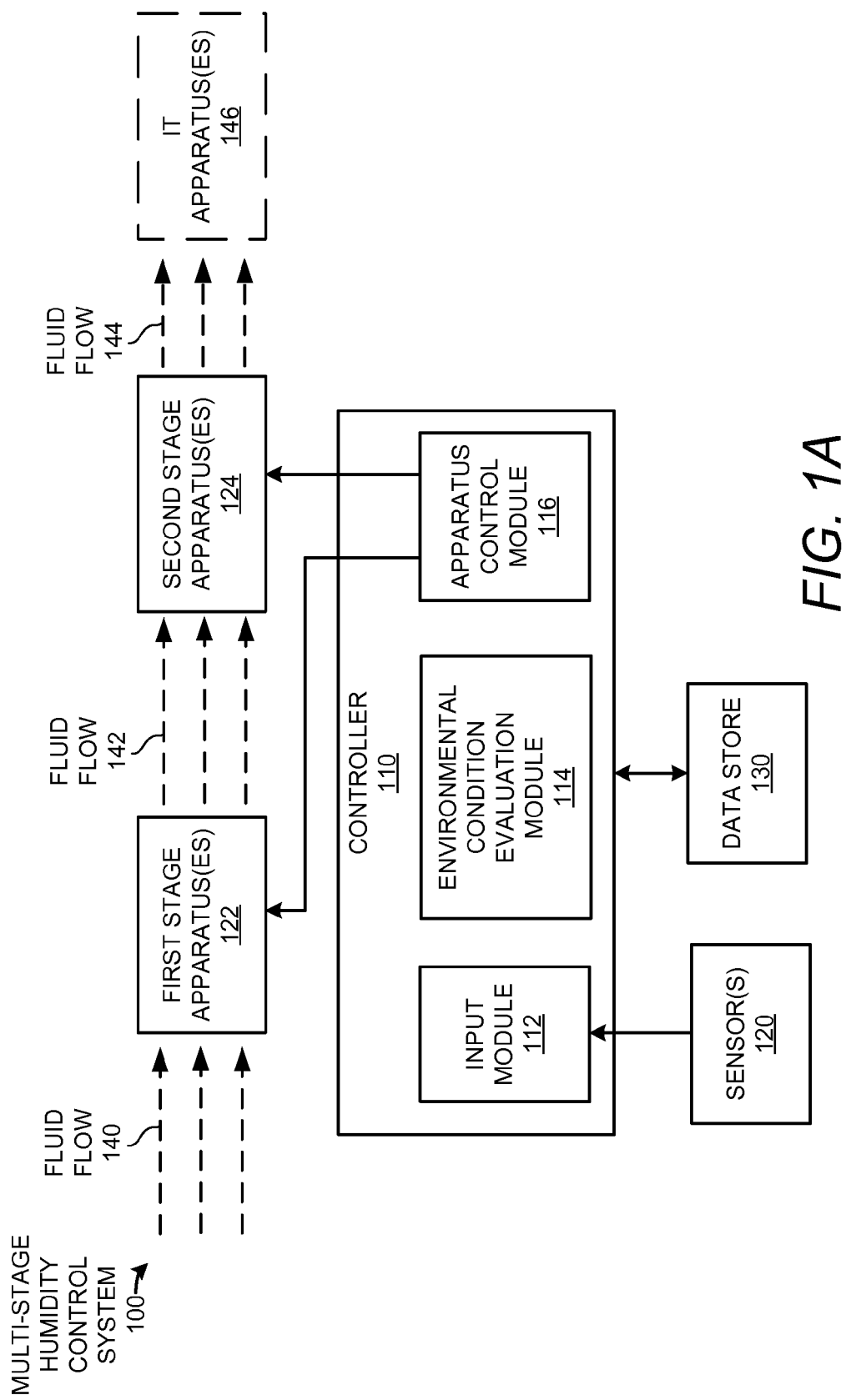
FIGS. 1A-1C show respective simplified block diagrams of systems for multistage control of humidity in a fluid flow supplied to or through at least one information technology apparatus, according to embodiments of the invention.

For simplicity and illustrative purposes, the present invention is described by referring mainly to an exemplary embodiment thereof. In the following description, numerous specific details are set forth in order to provide a thorough understanding of the present invention. It will be apparent however, to one of ordinary skill in the art, that the present invention may be practiced without limitation to these specific details. In other instances, well known methods and structures have not been described in detail so as not to unnecessarily obscure the present invention.

Disclosed herein are systems and methods for controlling humidity, relative humidity and/or absolute humidity, in fluid flow, such as, airflow, or other gaseous flow, supplied to or through one or more information technology (IT) apparatuses. The systems and methods disclosed herein employ a multi-stage arrangement of humidity control apparatuses. That is, a first stage humidity control apparatus is positioned upstream along a fluid flow path of a second stage humidity control apparatus, which is positioned upstream of the one or more IT apparatuses. Thus, both the first stage apparatus and the second stage apparatus affect the humidity level in the fluid flow supplied to or through the one or more IT apparatuses.

Through implementation of the systems and methods disclosed herein, the amount of energy required to ensure that the humidity level in the fluid flow supplied to or through the one or more IT apparatuses may substantially be minimized. In one regard, by implementing the multi-stage apparatuses to control the humidity level in the fluid flow, a relatively larger apparatus configured to operate at relatively high levels may be obviated. In another regard, the multi-stage apparatuses disclosed herein may improve the reliability of the humidity control apparatuses, may reduce the environmental footprint of the humidity control apparatuses, and/or may enable the humidity control apparatuses to operate at relatively lower costs as compared with conventional humidity control apparatuses.

In addition, the multi-stage apparatuses may be employed such that the first stage apparatus is operated to control humidity at a broad range and the second stage apparatus is operated to control humidity at a relatively finer range, to thereby provide more precise control as compared with the sole use of zonal apparatuses. This arrangement enables a broad range of humidity levels to be maintained at a zonal level and a relatively finer range of humidity levels to be maintained at local levels. In this regard, the IT apparatuses positioned at respective local areas in a zone may receive fluid flow having individualized levels of humidity. As such, various types of IT apparatuses requiring differing humidity levels may be positioned in the same zone. In addition, the amount of energy required to supply the IT apparatuses with fluid flows having the desired amounts of humidity may substantially be minimized through use of the multi-stage humidity control apparatuses. Moreover, the reliability of the humidity control apparatuses may be increased, the environmental footprint of the humidity control apparatuses may be reduced, and/or the humidity control apparatuses may operate at relatively lower costs as compared with conventional humidity control apparatuses in supplied the IT apparatuses with fluid flows having the desired humidity levels through use of the multi-stage humidity control apparatuses disclosed herein.

With reference first to FIG. 1A, there is shown a simplified block diagram of a system 100 for multistage control of humidity in a fluid flow supplied to or through at least one information technology (IT) apparatus, according to an example. It should be understood that the system 100 may include additional elements and that some of the elements described herein may be removed and/or modified without departing from the scope of the system 100.

As shown, the system 100 includes a controller 110, one or more sensors 120, a first stage apparatus 122, a second stage apparatus 124, and a data store 130. The controller 110 is depicted as including an input module 112, an environmental condition evaluation module 114, and an apparatus control module 116. In addition, the controller 110 may comprise software, firmware, hardware, or a combination thereof.

In instances where the controller 110 comprises software, the controller 110 may be stored on a computer readable storage medium and may be executed by the processor of a computing device. In these instances, the modules 112-116 may comprise software modules or other programs or algorithms configured to perform the functions described herein below. In instances where the controller 110 comprises firmware or hardware, the controller 110 may comprise a circuit or other apparatus configured to perform the functions described herein. In these instances, the modules 112-116 may comprise one or more of software modules and hardware modules.

Thus, by way of example, the controller 110 may comprise a processor of a computing device and the modules 112-116 may comprise software modules stored on a computer readable storage medium. The computer readable storage medium may comprise the data store 130 or a separate storage device. In addition, the data store 130 may comprise volatile and/or non-volatile memory, such as DRAM, EEPROM, MRAM, flash memory, and the like. In addition, or alternatively, the data store 130 may comprise a device configured to read from and write to a removable media, such as, a floppy disk, a CD-ROM, a DVD-ROM, or other optical or magnetic media.

In any regard, the controller 110 may be executed or implemented to control humidity levels in fluid flow 140-144 supplied to at least one information technology (IT) apparatus 146. The IT apparatus 146 has been depicted with dashed lines to indicate that the IT apparatus 146 does not form part of the system 100 and to also illustrate a relationship between the IT apparatus 146 and the fluid flow 140-144 that is supplied to the IT apparatus 146.

According to a first example, the IT apparatus 146 comprises an electronic device that may be affected by humidity levels in fluid flow supplied into or through the electronic device, such as, computing devices, servers, hard disk drives, network switches, power supplies, etc. The IT apparatus 146 may also comprise a subcomponent of the electronic devices, such as, processors, graphics processors, memories, semiconductor devices, etc. According to another example, the IT apparatus 146 comprises a structure that houses or supports one or more of such electronic devices, such as, an electronics rack, a plurality of electronics racks, an enclosure that houses a plurality of blade servers, an electronics cabinet, etc.

The input module 112 generally operates to receive input from the one or more sensors 120, which are positioned to detect one or more environmental conditions of the fluid flow 140-144 at one or more locations along the fluid flow 140-144 path. The one or more environmental conditions may include, for instance, temperature, humidity, pressure, volume flow rate, etc. In addition, the controller 110 may store the data received from the one or more sensors 120 in the data store 130.

The data store 130 may also store information pertaining to one or more predetermined ranges of humidity, which may be characterized as relative humidity and/or absolute humidity. The one or more predetermined ranges may comprise ranges that correlate to or closely correlate to acceptable humidity ranges for the IT apparatus 146 or for one or more components contained in the IT apparatus 146, as described in greater detail herein below. In addition or alternatively, the one or more predetermined ranges may also be modified from initially set ranges, for instance, to be in line with additional environmental variables, based upon changes to other performance parameters, such as modification or replacement of the IT apparatus 146, to meet a target objective, such as a service level agreement, an exergy target, a cost target, a performance target, etc., and the like.

According to an example, the data store 130 may store a first predetermined range and a second predetermined range, where the second predetermined range is within the first predetermined range. In this example, the second predetermined range may comprise a range of humidity levels that correlates to the acceptable humidity level range for the IT apparatus 146 or for one or more components contained in the IT apparatus 146. For instance, the second predetermined range may comprise a range of acceptable humidity levels as set forth by the manufacturer of the IT apparatus 146 or for one or more components contained in the IT apparatus 146, as determined through testing, as set forth in one or more standards, such as ASHRAE, OSHA, etc. In addition, the first predetermined range may comprise a range of humidity levels that is larger than the second predetermined range.

By way of example, the first predetermined range of humidity levels may be between about 20 to 80 percent and the second predetermined range may be between about 40 to 55 percent. As described in greater detail herein below, the first stage apparatus 122 may operate to maintain the humidity within the first predetermined range and the second stage apparatus 124 may operate to maintain the humidity within the second predetermined range. In one regard, the staged operation of the first stage apparatus 122 and the second stage apparatus 124 enables both of the first stage apparatus 122 and the second stage apparatus 124 to be configured to operate at relatively smaller humidity ranges as compared to operating them individually to achieve a desired humidity result.

In any regard, the controller 110 is configured to implement or execute the environmental condition evaluation module 114 to determine whether the detected one or more environmental conditions indicates that the humidity level of the fluid flow 144 supplied to the IT apparatus 146 is within the first predetermined range or the second predetermined range. More particularly, the environmental condition evaluation module 114 is configured to determine the humidity level in the fluid flow at the one or more locations where the environmental condition is detected by the sensor(s) 120 based upon the data received from the sensor(s) 120. In addition, the environmental condition evaluation module 114 is configured to compare the humidity level of the fluid flow with the predetermined ranges stored in the data store 130.

According to a first example in which the environmental condition detected by the sensor(s) 120 is humidity, such as, relative humidity and/or absolute humidity, the environmental condition evaluation module 114 is configured to directly compare the detected humidity level with the predetermined ranges stored in the data store 130. According to a second example in which the environmental condition detected by the sensors(s) 120 is a condition other than humidity, such as, temperature, mass flow rate, etc., the environmental condition evaluation module 114 may calculate the humidity based upon the detected environmental condition. By way of example, in the event that the detected environmental condition comprises temperature, the environmental condition evaluation module 114 may calculate the relative humidity of the fluid flow based upon the detected temperature and the dew point temperature of the fluid flow.

The controller 110 is further configured to implement or execute the apparatus control module 116 in response to results of the evaluation performed by the environmental condition evaluation module 114. The apparatus control module 116 depicted in FIG. 1A is configured to have control over both the first stage apparatus 122 and the second stage apparatus 124 to vary the humidity levels in the fluid flow 140-144 supplied to or through the IT apparatus 146.

Generally speaking, the first stage apparatus 122 and the second stage apparatus 124 are configured to vary humidity levels in fluid flow supplied to or through the IT apparatus 146 in a staged manner. In one example, the first stage apparatus 122 and the second stage apparatus 124 are configured to operate in tandem, such that, for instance, the first stage apparatus 122 adds a partial amount of moisture content into the fluid flow and the second stage apparatus 124 adds a remaining amount of moisture content into the fluid flow to cause the fluid flow 144 to have the desired humidity level.

In another example, the first stage apparatus 122 is configured to vary humidity levels in the fluid flow 140-144 within a first range of humidity levels and the second stage apparatus 124 is configured to vary humidity levels in the fluid flow 140-144 within a second range of humidity levels, where the second range is within the first range. In this regard, the first stage apparatus 122 may be operated to vary humidity levels of the fluid flows 140-144 over a broad range of humidity levels and the second stage apparatus 124 may be operated to vary humidity levels in the fluid flows 140-144 over a relatively narrower range of humidity levels.

By way of example, the first stage apparatus 122 may be configured to vary humidity levels over an area, which may be considered as a zone. In this example, the second stage apparatus 124 may be configured to vary humidity levels over a particular local area of the zone, and the zone may be composed of a plurality of local areas. As such, the first stage apparatus 122 may be employed to control humidity levels over the zone and the second stage apparatus 124 may be employed to control humidity levels in a particular local area of the zone. One result of this staged humidity control is that the humidity control may be individually controlled by individual second stage apparatuses 124 over particular local areas of the zone while also receiving assistance from the first stage apparatus 122. As such, the second stage apparatuses 124 may be made to operate within a relatively smaller or finer humidity range, which may reduce their sizes and costs.

By way of another particular example, the zone may comprise a room, such as a data center, and the local areas may comprise particular rows of racks, individual racks, servers, processors, hard disk drives, network switches, etc., in the data center. As another example, the zone may comprise a row of racks and the local areas may comprise particular racks, servers, processors, hard disk drives, network switches, etc., housed in the row of racks. As a further example, the zone may comprise a rack and the local areas may comprise particular servers, processors, hard disk drives, network switches, etc., housed in the rack. As a yet further example, the zone may comprise a server and the local areas may comprise particular processors, memories, power supplies, etc., contained in the server.

In a second example, the first stage apparatus 122 may be in relatively close proximity to the second stage apparatus 124. In this example, similar to the first example, the first stage apparatus 122 may be configured to vary humidity levels in the fluid flow 142 supplied through the second stage apparatus 124. However, this example differs from the first example because both the first stage apparatus 122 and the second stage apparatus 124 are associated with a particular local area.

In any regard, the apparatus control module 116 is configured to manipulate an operation of at least one of the first stage apparatus 122 and the second stage apparatus 124 to vary humidity levels in the fluid flow supplied to or through the IT apparatus 146 based upon the environmental condition detected by the sensor(s) 120. Various manners in which the apparatus control module 116 operates to manipulate the first stage apparatus 122 and the second stage apparatus 124 are described in greater detail herein below.

Although not shown, the second stage apparatus 124 may be contained within the IT apparatus 146 to be in a position to vary humidity levels within the IT apparatus 146, without departing from a scope of the system 100. In addition, although the controller 110 is depicted as controlling a single first stage apparatus 122 and a single second stage apparatus 124, the controller 110 may be configured to control any number of first stage apparatuses 122 and second stage apparatuses 124 without departing from a scope of the system 100. Moreover, it should be understood that the multi-stage humidity control system 100 may include one or more additional humidity apparatuses (not shown) positioned along the fluid flow 140-144 path to enable further control over the humidity in the fluid flow 140-144 path without departing from a scope of the system 100.

In the example depicted in FIG. 1A, the first stage apparatus 122 and the second stage apparatus 124 may comprise apparatuses configured to directly or indirectly vary humidity levels in the fluid flow 140-144. Examples of apparatuses that directly vary humidity levels in the fluid flow 140-144 are humidifiers/dehumidifiers that operate to directly add or remove moisture from the fluid flow 140-144, such as, water misters, hydrogen ion conductors composed of a solid electrolyte and a pair of electrodes, etc. Examples of apparatuses that indirectly vary humidity levels in the fluid flow 140-144 are cooling coil sections of water-chiller-type heat exchangers, evaporator sections of vapor-compression-type heat exchangers, etc.

Figure 1B:
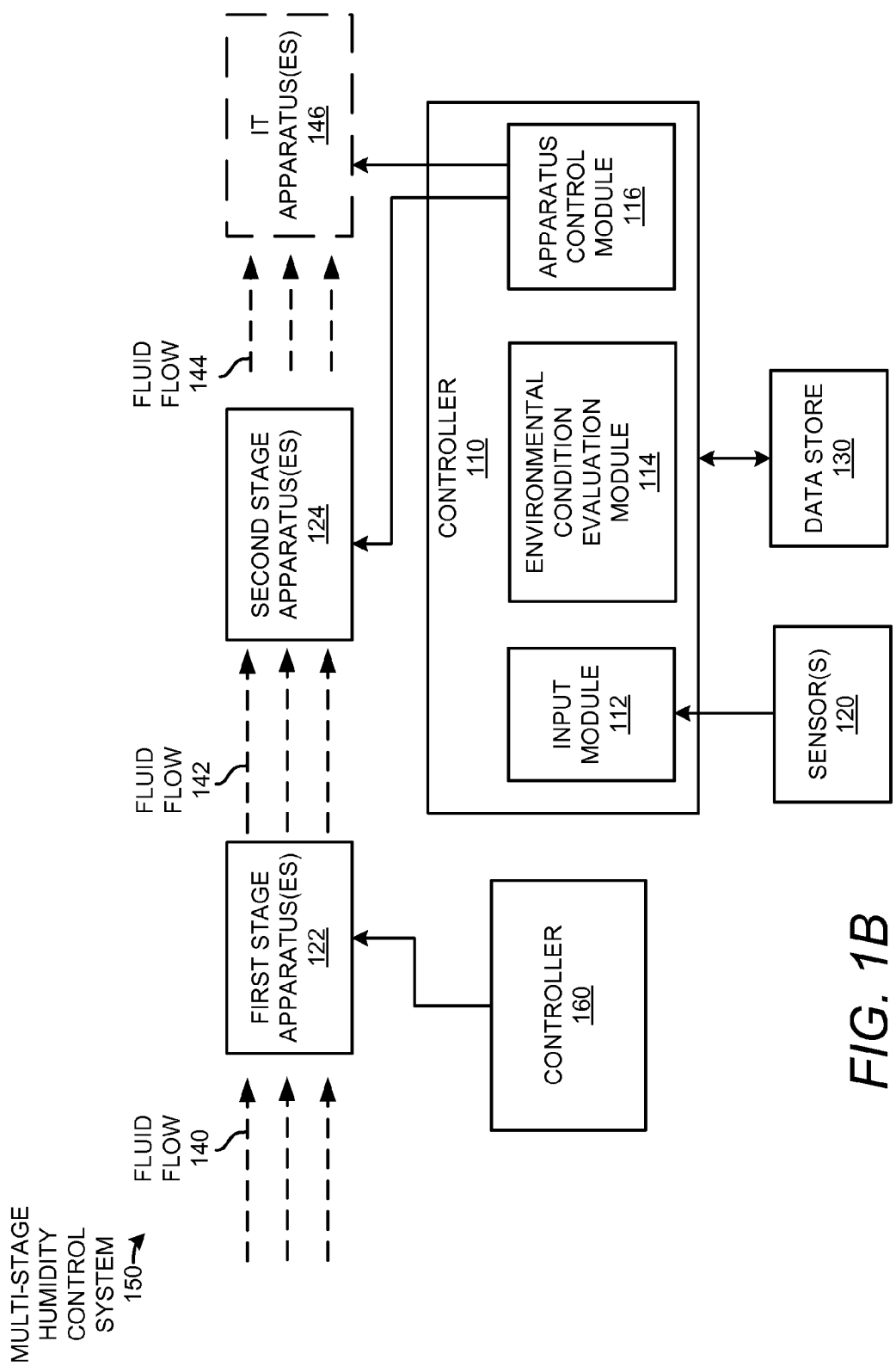

With reference now to FIG. 1B, there is shown a simplified block diagram of a system 150 for multistage control of humidity levels in a fluid flow supplied to or through at least one IT apparatus, according to another example. The system 150 includes all of the same elements as the system 100 depicted in FIG. 1A and thus a detailed description of the common elements will not be provided with respect to FIG. 1B. Instead, only those elements that differ from FIG. 1A will be described with respect to FIG. 1B.

As shown in FIG. 1B, the system 150 includes another controller 160 for controlling the first stage apparatus 122. The controller 160 may have the same configuration as or a different configuration from the controller 110. In addition, the controller 160 may also receive detected environmental condition information from sensors and may also be interfaced with a data store. Generally speaking, the system 150 depicted in FIG. 1B enables the first stage apparatus 122 to be controlled independently of the second stage apparatus 124.

In one example, the controller 160 may operate completely independently of the controller 110 and thus the controllers 160 and 110 may independently operate the first stage apparatus 122 and the second stage apparatus 124 to achieve different goals. In another example, the controller 160 may be interfaced with the controller 110 such that information pertaining to how the first stage apparatus 122 and the second stage apparatus 124 are being operated may be shared between the controllers 110 and 160. In this example, the controllers 110 and 160 may operate to achieve a common goal, such as an energy efficiency goal.

Figure 1C:
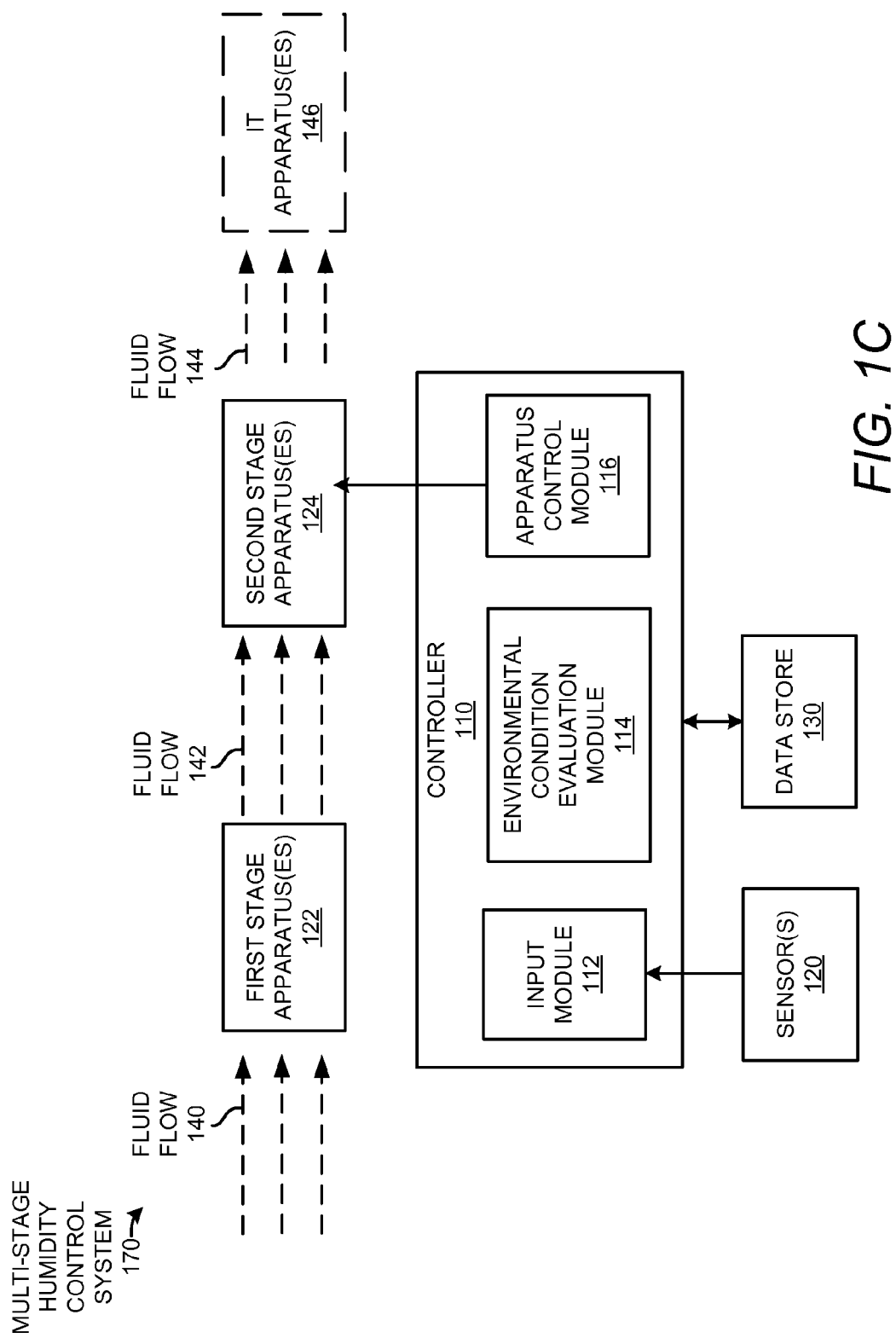

Turning now to FIG. 1C, there is shown a simplified block diagram of a system 170 for multistage control of humidity levels in a fluid flow supplied to at least one IT apparatus, according to a further example. The system 170 includes all of the same elements as the system 100 depicted in FIG. 1A and thus a detailed description of the common elements will not be provided with respect to FIG. 1C. Instead, only those elements that differ from FIG. 1A will be described with respect to FIG. 1C.

As shown, the controller 110 is configured to control the second stage apparatus 124. In addition, the first stage apparatus 122 is not connected to a controller. In the example shown in FIG. 1C, therefore, the first stage apparatus 122 generally comprises an apparatus that is configured to operate at a set level. By way of example, the first stage apparatus 122 may comprise any of the direct and indirect humidity control apparatuses discussed above and may be set to operate at a particular level. For instance, if the first stage apparatus 122 comprises a cooling coil of a water-chiller-type heat exchanger, the temperature of the water flowing through the cooling coil may be maintained at a particular level, thus causing the fluid flow 142 supplied to the second stage apparatus 124 to have a particular relative humidity level. In this example, the controller 110 may manipulate operations of the second stage apparatus 124 to vary the humidity levels in the fluid flow 144 supplied to or through the IT apparatus 146 based upon or in conjunction with the operations of the first stage apparatus 122.

In the example depicted in FIG. 1C, the first stage apparatus 122 may comprise a passive apparatus for varying humidity levels in fluid flow, such as, a desiccant material configured to remove a desired amount of moisture from the fluid flow 140. As an alternative to the system 170 depicted in FIG. 1C, the controller 110 may be configured to control the first stage apparatus 122 instead of the second stage apparatus 124. In this alternative example, the second stage apparatus 124 may be set to operate at a particular level or may comprise a passive device, such as a device containing a desiccant material.

Examples of methods in which one or more of the systems 100, 150, 170 may be employed to control humidity levels in the fluid flow 140-144 supplied to or through the IT apparatus 146 will now be described with respect to the following flow diagrams of the methods 200 and 220 depicted in FIGS. 2A and 2B. It should be apparent to those of ordinary skill in the art that the methods 200 and 220 represent generalized illustrations and that other steps may be added or existing steps may be removed, modified or rearranged without departing from the scopes of the methods 200 and 220.

The descriptions of the methods 200 and 220 are made with reference to the systems 100, 150, 170 illustrated in FIGS. 1A-1C, respectively, and thus makes reference to the elements cited therein. More particularly, the controller 110 may implement or execute one or more of the modules 112-116 to perform the methods 200 and 220 in controlling the humidity levels in the fluid flow 140-144. It should, however, be understood that the methods 200 and 220 are not limited to the elements set forth in the systems 100, 150, 170. Instead, it should be understood that the methods 200 and 220 may be practiced by a system having a different configuration than that set forth in the systems 100, 150, 170.

Figures 2A, 2B:
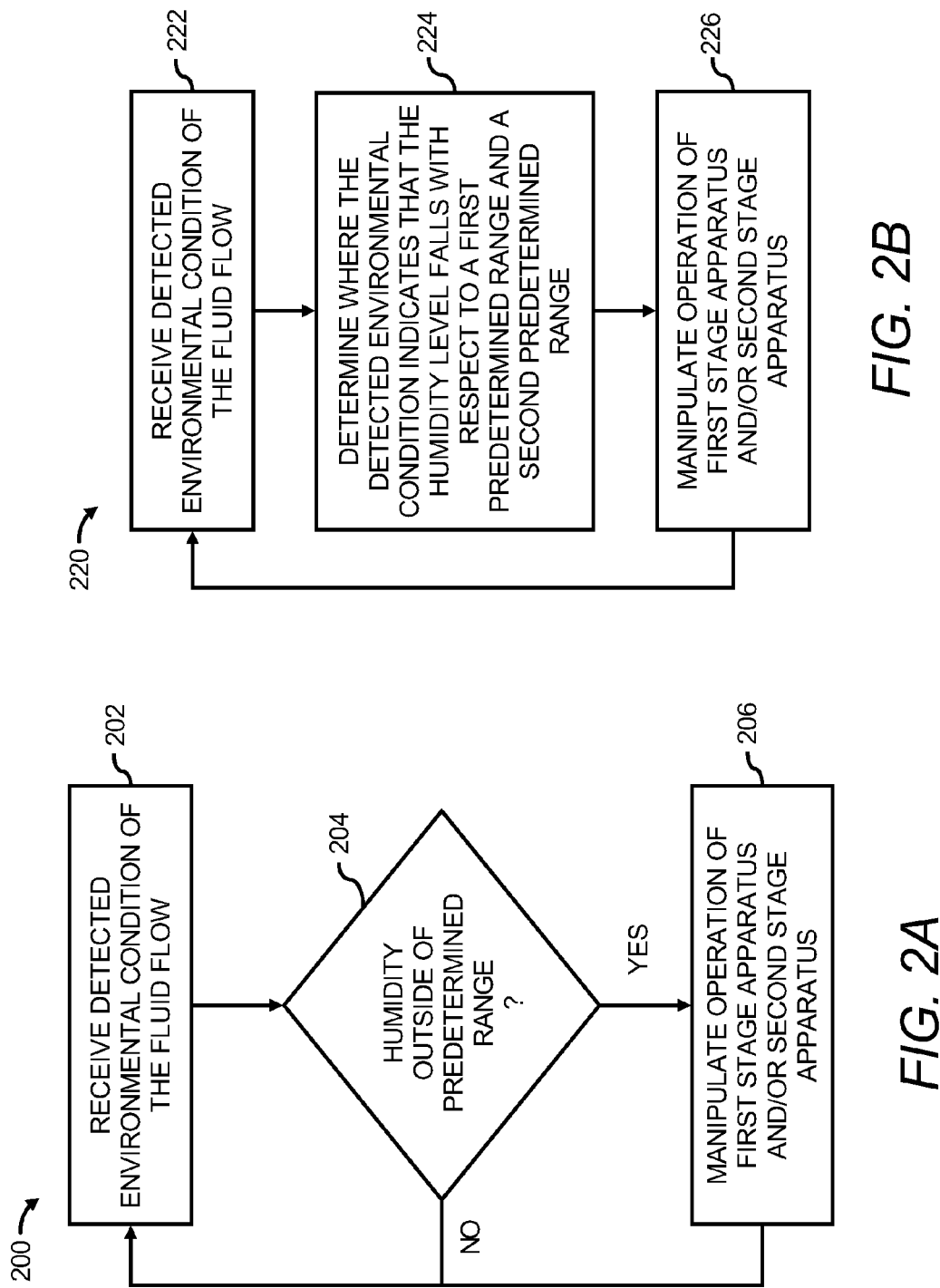
FIGS. 2A and 2B show respective flow diagrams of methods of controlling humidity in the fluid flow supplied to or through at least one information technology apparatus using a multi-stage humidity level control system, according to embodiments of the invention.

FIGS. 2A and 2B, more particularly, show respective flow diagrams of methods 200 and 220 of controlling humidity levels in the fluid flow 140-144 supplied to or through at least one IT apparatus 146 using a multi-stage humidity level varying system. The multi-stage humidity level varying system includes at least a first stage apparatus 122 and a second stage apparatus 124 positioned to influence humidity levels in the fluid flow 122-124 supplied to or through the one or more IT apparatuses 146.

With reference first to FIG. 2A, at step 202, the controller 110 receives environmental condition information of the fluid flow 140-144 at one or more locations along the fluid flow 140-144 path from one or more sensors 120. The one or more locations where the environmental condition information is detected may also include a location in the fluid flow path that is exhausted from the IT apparatus 146.

At step 204, the controller 110 determines whether the humidity, such as, relative humidity and/or absolute humidity, of the fluid flow 140-144 is outside of a predetermined range. According to an example, the humidity level is detected at or derived for an inlet or an internal location of the IT apparatus 146. In this example, the predetermined range may comprise a range of humidity levels that correlate to or closely correlate to acceptable humidity ranges for the IT apparatus 146 or for one or more components contained in the IT apparatus 146. In addition, the predetermined range may be based upon manufacturer suggested operating conditions, determined through testing, obtained from one or more standards, such as ASHRAE, etc. Moreover, as discussed above, the predetermined range may be modified from an originally set range under various circumstances.

The predetermined range may also vary depending upon where along the fluid flow 140-144 path the environmental condition is detected or derived. For instance, the predetermined range in the fluid flow 142 may be higher than the predetermined range in the fluid flow 144 because the humidity level need not be at a particular range until the fluid flow 144 reaches the IT apparatus 146.

In instances where the detected environmental condition comprises a direct measure of humidity, the controller 110 may directly compare the detected humidity level with the predetermined range in determining whether the humidity level is outside of the predetermined range at step 204. In instances where the detected environmental condition comprises an indirect measure of humidity, such as, temperature, mass flow rate, etc., the controller 110 may perform conventional operations to convert the detected environmental condition information into a measure of humidity. By way of example, the controller 110 may derive the relative humidity of the fluid flow 140-144 from the temperature of the fluid flow and the dew point temperature of the fluid flow 140-144.

In any regard, if the controller 110 determines that the humidity level of the fluid flow 140-144 is within the predetermined range at step 204, the controller 110 may continue to receive the detected environmental condition from the one or more sensors 120 at step 202. In addition, the controller 110 may repeat steps 202 and 204 until the controller 110 determines that a detected or derived humidity level is outside of the predetermined range at step 204.

In response to a determination that the humidity level in the fluid flow 140-144 is outside of the predetermined range, the controller 110 manipulates the operation of the at least one of the first stage apparatus 122 and the second stage apparatus 124 to vary the humidity level. According to a first example, the controller 110 is configured to control either or both of the first stage apparatus 122 and the second stage apparatus 124 as depicted in FIG. 1A. In a second example, a plurality of controllers 110, 160 are configured to control respective ones of the first stage apparatus 122 and the second stage apparatus 124 as depicted in FIG. 1B. In a third example, the controller 110 is configured to control one of the first stage apparatus 122 and the second stage apparatus 124 over which the controller 110 has control.

In any of the examples above, the controller 110, 160 is configured to control one or more of the first stage apparatus 122 and the second stage apparatus 124 to add moisture into the fluid flow 140-144 in response to the detected or derived humidity falling below the predetermined range. Likewise, the controller 110, 160 is configured to control one or more of the first stage apparatus 122 and the second stage apparatus 124 to remove moisture from the fluid flow 140-144 in response to the detected or derived humidity levels exceeding the predetermined range. According to another example in which the first stage apparatus 122 or the second stage apparatus 124 comprises an apparatus for indirectly controlling the humidity level, such as a coil containing chilled water, the controller 110, 160 may manipulate either or both of the temperature and the flow rate of the chilled water flowing through the coil to thereby vary the relative humidity level of the fluid flow flowing past the first stage apparatus 122 or the second stage apparatus 124.

Turning now to FIG. 2B, at step 222, the controller 110 receives environmental condition information of the fluid flow 140-144 at one or more locations along the fluid flow 140-144 path from one or more sensors 120 in manners similar to those described above with respect to step 202 in the method 200.

At step 224, the controller 110 determines where the detected environmental condition indicates that the humidity level falls with respect to a first predetermined range and a second predetermined range. The second predetermined range may comprise a range of humidity levels that correlates to the acceptable humidity range for the IT apparatus 146 or for one or more components contained in the IT apparatus 146. In this regard, the second predetermined range may comprise the same range as the predetermined range discussed above with respect to the method 200 in FIG. 2A.

The first predetermined range may comprise a range of humidity levels that is relatively larger than the second predetermined range. By way of particular example, the first predetermined range of humidity levels may be between about 20 to 80 percent and the second predetermined range may be between about 40 to 55 percent. As discussed above, the first predetermined range and the second predetermined range may be modified from originally set ranges under various circumstances and may also vary depending upon where along the fluid flow 140-144 path the environmental condition is detected or derived. For instance, the first predetermined range in the fluid flow 144 may be higher than the first predetermined range in the fluid flow 142 because the humidity level need not be at a particular range until the fluid flow 144 reaches the IT apparatus 146. In addition, the humidity level detected or derived for the fluid flow 142 may be compared with the first predetermined range and the humidity level detected or derived for the fluid flow 144 may be compared with the second predetermined range.

At step 226, the controller 110, 160 is configured to manipulate an operation of one or both of the first stage apparatus 122 and the second stage apparatus 124 based upon where the detected or derived humidity level falls with respect to the first predetermined range and the second predetermined range. For instance, if the humidity level falls outside of the first predetermined range, the controller 110, 160 may manipulate the first stage apparatus 122 to bring the humidity level within the first predetermined range. As another example, the controller 110 may manipulate the second stage apparatus 124 to operate a relatively higher level to ensure that the humidity level remains within the second predetermined range. As a yet further example, the controller 110, 160 may manipulate both of the first stage apparatus 122 and the second stage apparatus 124 to ensure that the humidity level remains within the second predetermined range in response to the humidity level falling outside of the first predetermined range.

If the humidity level falls outside of the second predetermined range, but remains within the first predetermined range, for instance in the fluid flow 142, the controller 110 may manipulate the second stage apparatus 124 to ensure that the humidity level of the fluid flow 144 supplied into the IT apparatus 146 remains within the second predetermined range.

In addition, the controller 110, 160 may receive the detected environmental condition information from the one or more sensors 120 again at step 222 and may repeat steps 222-226 to continuously monitor and manipulate the first stage apparatus 122 and/or the second stage apparatus 124 to substantially ensure that the fluid flow 144 supplied into or through the IT apparatus 146 has a desired humidity level.

In addition, the method 200 and/or the method 220 may be implemented by one or more controllers 110, 160 to control humidity levels in fluid flow supplied into or through one or more IT apparatuses 146. Thus, for example, the method 200 and/or the method 220 may be implemented to by separate controller 110, 160 for separate humidity control apparatuses positioned with respect to different IT apparatuses 146. In this example, the separate controllers 110, 160 may operate to ensure that the fluid flows supplied to or through each of the different IT apparatuses 146 are at respective desired humidity levels.

Some or all of the operations set forth in the methods 200 and 220 may be contained as utilities, programs, or subprograms, in any desired computer accessible medium. In addition, the methods 200 and 220 may be embodied by computer programs, which can exist in a variety of forms both active and inactive. For example, they may exist as software program(s) comprised of program instructions in source code, object code, executable code or other formats. Any of the above may be embodied on a computer readable medium, which include storage devices.

Exemplary computer readable storage devices include conventional computer system RAM, ROM, EPROM, EEPROM, and magnetic or optical disks or tapes. Concrete examples of the foregoing include distribution of the programs on a CD ROM or via Internet download. It is therefore to be understood that any electronic device capable of executing the above-described functions may perform those functions enumerated above.

Figure 3:
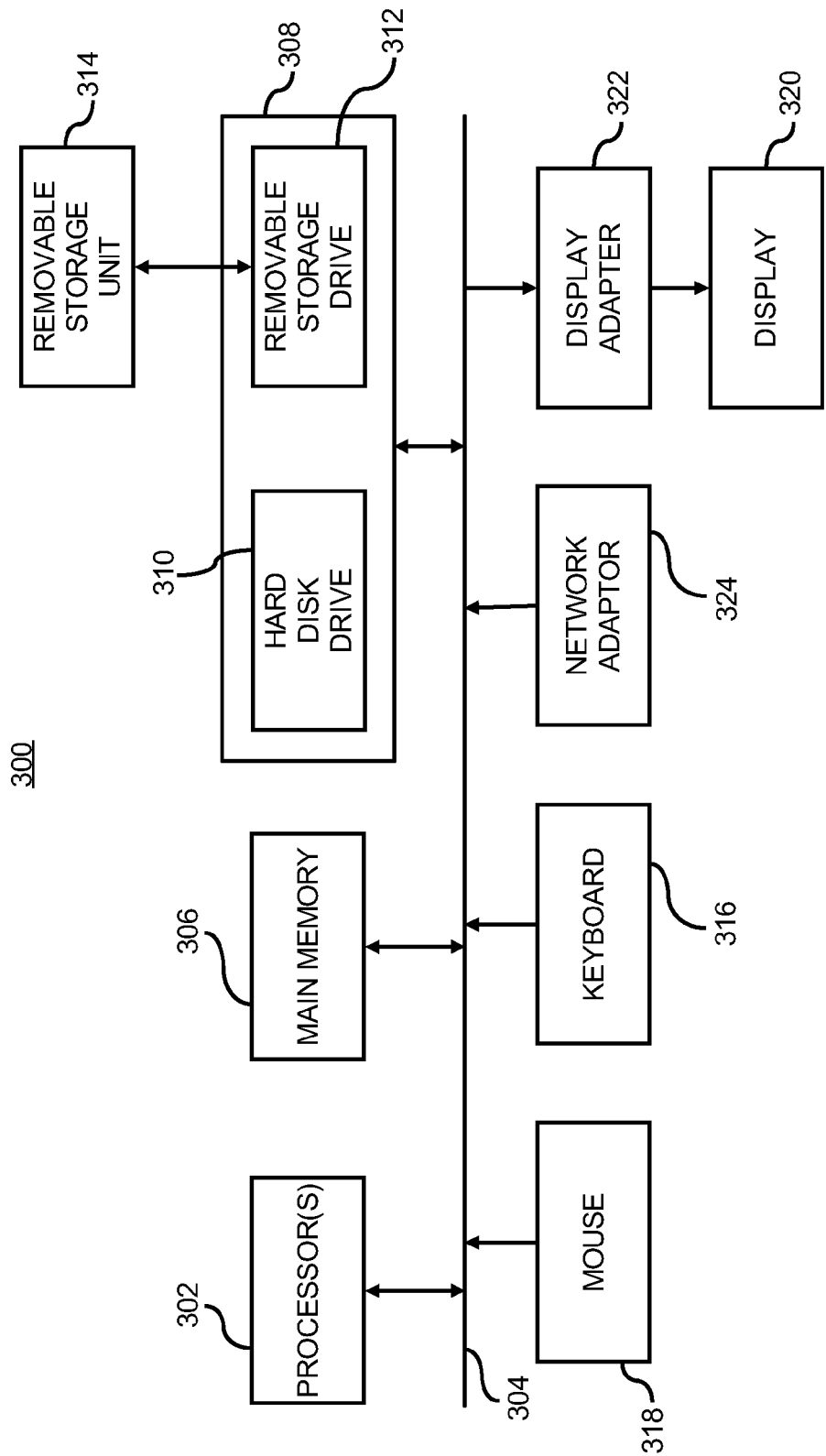
FIG. 3 shows a block diagram of a computing apparatus configured to implement or execute the controller depicted in FIGS. 1A-1C, according to an embodiment of the invention.

FIG. 3 illustrates a block diagram of a computing apparatus 300 configured to implement or execute the controller 110, 160 depicted in FIGS. 1A-1C, according to an example. In this respect, the computing apparatus 300 may be used as a platform for executing one or more of the functions described hereinabove with respect to the controller 110, 160.

The computing apparatus 300 includes a processor 302 that may implement or execute some or all of the steps described in the methods 200 and 220. Commands and data from the processor 302 are communicated over a communication bus 304. The computing apparatus 300 also includes a main memory 306, such as a random access memory (RAM), where the program code for the processor 302, may be executed during runtime, and a secondary memory 308. The secondary memory 308 includes, for example, one or more hard disk drives 310 and/or a removable storage drive 312, representing a floppy diskette drive, a magnetic tape drive, a compact disk drive, etc., where a copy of the program code for the methods 200 and 220 may be stored.

The removable storage drive 310 reads from and/or writes to a removable storage unit 314 in a well-known manner. User input and output devices may include a keyboard 316, a mouse 318, and a display 320. A display adaptor 322 may interface with the communication bus 304 and the display 320 and may receive display data from the processor 302 and convert the display data into display commands for the display 320. In addition, the processor(s) 302 may communicate over a network, for instance, the Internet, LAN, etc., through a network adaptor 324.

It will be apparent to one of ordinary skill in the art that other known electronic components may be added or substituted in the computing apparatus 300. It should also be apparent that one or more of the components depicted in FIG. 3 may be optional (for instance, user input devices, secondary memory, etc.).

What has been described and illustrated herein is a preferred embodiment of the invention along with some of its variations. The terms, descriptions and figures used herein are set forth by way of illustration only and are not meant as limitations. Those skilled in the art will recognize that many variations are possible within the scope of the invention, which is intended to be defined by the following claims—and their equivalents—in which all terms are meant in their broadest reasonable sense unless otherwise indicated.

What is claimed is:

1. A system to control humidity in a fluid flow supplied to at least one information technology apparatus, said system comprising:
    a sensor to detect an environmental condition of the fluid flow;
    a first stage apparatus to vary humidity levels in the fluid flow;
    a second stage apparatus positioned downstream of the first stage apparatus, wherein the second stage apparatus is to further vary humidity levels in the fluid flow; and
    a controller to:
        receive the detected environmental condition of the fluid flow from the sensor;
        determine whether the detected environmental condition indicates that the humidity level in the fluid flow is outside of a first predetermined humidity range;
        in response to a determination that the humidity level of the fluid flow is outside of the first predetermined humidity range, manipulate an operation of the first stage apparatus to vary the humidity level in the fluid flow;
        determine whether the detected environmental condition indicates that the humidity level in the fluid flow is outside of a second predetermined humidity range different than the first predetermined humidity range, wherein the second predetermined humidity range is within the first predetermined humidity range; and
        in response to a determination that the humidity level of the fluid flow is outside of the second predetermined humidity range, manipulate an operation of the second stage apparatus to vary the humidity level in the fluid flow.

2. The system according to claim 1, wherein the first stage apparatus is to vary humidity levels in fluid flow supplied to a zone and the second stage apparatus is to vary humidity levels in fluid flow supplied to a local area within the zone, and wherein the second stage apparatus is to vary humidity levels at a finer humidity level as compared with the first stage apparatus.

3. The system according to claim 1, wherein the at least one information technology apparatus comprises a rack positioned in a room, and wherein the first stage apparatus comprises a humidity control apparatus to control humidity levels of the fluid flow in at least one zone of the room and wherein the second stage apparatus comprises a humidity control apparatus to control humidity levels of the fluid flow at an inlet of the rack.

4. The system according to claim 1, wherein the at least one information technology apparatus is housed in a rack, and wherein the first stage apparatus comprises a humidity control apparatus to control humidity levels of the fluid flow at an inlet of the rack and wherein the second stage apparatus comprises a humidity control apparatus to control humidity levels of the fluid flow flowing through the information technology apparatus.

5. The system according to claim 1, wherein the system is to provide multi-stage control of humidity levels in fluid flow supplied to a plurality of information technology apparatuses, said system further comprising:
    a plurality of sensors positioned to detect an environmental condition of the fluid flow supplied through each of the plurality of information technology apparatuses;
    a plurality of second stage apparatuses positioned to vary humidity levels of fluid flow supplied to each of said plurality of information technology apparatuses; and
    wherein the controller is further to independently manipulate an operation of each of the plurality of second stage apparatuses to vary the humidity levels in the fluid flow supplied through each of the plurality of information technology apparatuses based upon the environmental conditions detected by the respective plurality of sensors.

6. The system according to claim 1, wherein at least one of the first stage apparatus and the second stage apparatus comprises a cooling system having at least one of an air-to-air and a liquid-to-air heat exchanger positioned in the fluid flow to indirectly vary humidity levels of the fluid flow.

7. The system according to claim 1, wherein at least one of the first stage apparatus and the second stage apparatus comprises a device for directly one or both of adding moisture into and removing moisture from the fluid flow.

8. The system according to claim 1, wherein one of the first stage apparatus and the second stage apparatus comprises an active humidity varying device and wherein the other one of the first stage apparatus and the second stage apparatus comprises a passive humidity varying device.

9. A method to control humidity in fluid flow supplied to at least one information technology apparatus with a multi-stage humidity level varying system comprising a first stage apparatus to vary humidity levels in the fluid flow and a second stage apparatus positioned downstream of the first stage apparatus along the fluid flow, wherein the second stage apparatus is to further vary humidity levels in the fluid flow, said method comprising:

receiving a detected environmental condition of the fluid flow supplied at least one of near and within the at least one information technology apparatus;

determining whether the detected environmental condition indicates that the humidity level of the fluid flow is outside of a first predetermined humidity range;

in response to determining that the humidity level of the fluid flow is outside of the first predetermined humidity range, manipulating an operation of the first stage apparatus to vary the humidity level in the fluid flow;

determining whether the detected environmental condition indicates that the humidity level of the fluid flow is outside of a second predetermined humidity range different than the first predetermined humidity range, wherein the second predetermined humidity range is within the first predetermined humidity range; and in response to determining that the humidity level of the fluid flow is outside of the second predetermined humidity range, manipulating an operation the second stage apparatus to vary the humidity level in the fluid flow.

10. The method according to claim 9, wherein manipulating an operation of at least one of the first stage apparatus and the second stage apparatus further comprises manipulating operations of both the first stage apparatus and the second stage apparatus in response to the detected environmental condition indicating that the humidity level falls outside of the first humidity predetermined range.

11. The method according to claim 9, further comprising:
receiving, from a plurality of sensors, respective detected environmental conditions of the fluid flow supplied through each of a plurality of information technology apparatuses; and manipulating an operation of at least one of a plurality of second stage apparatuses independently from at least another one of the plurality of second stage apparatuses based upon the environmental conditions detected by the respective plurality of sensors.

12. The method according to claim 9, wherein manipulating the at least one of the first stage apparatus and the second stage apparatus further comprises manipulating an operation of at least one of the first stage apparatus and the second stage apparatus to vary humidity levels in the fluid flow in at least one of an indirect and a direct manner.

13. A non-transitory computer readable storage medium on which is embedded one or more computer programs, said one or more computer programs implementing a method of controlling humidity levels in fluid flow supplied to at least one information technology apparatus with a multi-stage humidity level varying system comprising a first stage apparatus to vary humidity levels in the fluid flow and a second stage apparatus positioned downstream of the first stage apparatus along the fluid flow, wherein the second stage apparatus is to further vary humidity levels in the fluid flow, said one or more computer programs comprising a set of instructions that when executed, cause a processor to:

receive data pertaining to a detected environmental condition of a fluid flow supplied at least one of near and within the at least one information technology apparatus;

determine whether the detected environmental condition indicates that the humidity level of the fluid flow is outside of a first predetermined humidity range;

in response to a determination that the humidity level is outside of the first predetermined humidity range, manipulate an operation of the first stage apparatus to vary the humidity level in the fluid flow;

determine whether the detected environmental condition indicates that the humidity level of the fluid flow is outside of a second predetermined humidity range, wherein the second predetermined humidity range is within the first predetermined humidity range; and in response to a determination that the humidity level is outside of the second predetermined humidity range, manipulate an operation of the second stage apparatus to vary the humidity level in the fluid flow.

* * * * *